US007766514B2

(12) United States Patent
Chen (10) Patent No.: US 7,766,514 B2
(45) Date of Patent: Aug. 3, 2010

(54) LIGHT EMITTING DIODE LAMP WITH HIGH HEAT-DISSIPATION CAPACITY

(76) Inventor: Hon-Wen Chen, No. 3, Alley 8, Lane 86, Taishan Rd., Yilan City, Yilan County (TW)

( * ) Notice: Subject to any disclaimer, the term of this patent is extended or adjusted under 35 U.S.C. 154(b) by 67 days.

(21) Appl. No.: 12/155,494

(22) Filed: Jun. 5, 2008

(65) Prior Publication Data
US 2009/0303735 A1      Dec. 10, 2009

(51) Int. Cl.
*F21V 29/00*      (2006.01)
(52) U.S. Cl. ..................................... 362/294; 362/257
(58) Field of Classification Search .............. 362/294, 362/257
See application file for complete search history.

(56) References Cited

U.S. PATENT DOCUMENTS

| 5,606,358 | A | * | 2/1997 | Beaman | 347/237 |
| 6,274,924 | B1 | * | 8/2001 | Carey et al. | 257/676 |
| 2005/0224830 | A1 | * | 10/2005 | Blonder et al. | 257/100 |
| 2007/0201232 | A1 | * | 8/2007 | Chen | 362/294 |

* cited by examiner

*Primary Examiner*—David V Bruce
(74) *Attorney, Agent, or Firm*—Rosenberg, Klein & Lee (57) ABSTRACT

This invention relates to a light emitting diode lamp with high heat-dissipation capacity wherein the lamp has at least one heat-dissipating unit, a plurality of air-flow channels being provided within each heat sink unit, an electrical insulation layer with high heat-conductivity being provided on the surface of the light emitting diode mounted with heat-dissipating unit, a metal circuit being formed on the electrical insulation layer with high heat-conductivity according to demand, at least one light emitting diode being packaged on the metal circuit such that provision of circuit board or coating of heat sink paste become unnecessary for the lamp.

18 Claims, 11 Drawing Sheets

LIGHT EMITTING DIODE LAMP WITH HIGH HEAT-DISSIPATION CAPACITY

BACKGROUND OF THE INVENTION

1. Field of the Invention

This invention relates to a light emitting diode lamp with high heat-dissipation capacity, particularly to a lamp without the additional need of a circuit board, and the lamp itself has heat sink unit so as to obtain performance with good heat dissipation efficiency.

2. Brief Description of the Prior Art

Accompanying with perpetual increase of the power of light emitting diode (LED), the percentage of using LED as lamp for illumination is gradually boosted. However, the working waste heat of LED is relatively increased with respect to the raising of power. The temperature increase of the high power LED, reduction on working efficiency and even the damage of LED will be happened if the exhausted waste heat amount is unable to be raised. When reviewing the present method of heat dissipation for LED lamp, for example the working waste heat of LED contacts with the heat sink through the circuit board and heat sink paste, there are three major defects of heat resistance in the present method of heat dissipation for LED lamp listed as follow.

1. A layer of polymer with high heat-resistance for insulation package exists between the heat sink and the LED components such that the heat generated by the LED is unable to be transferred to the heat sink promptly due to the low thermal conduction efficiency of the polymer layer. Thus, the temperature increase of the LED, reduction on working efficiency and even the damage of LED will be caused to happen.
2. LED is mounted on the polymer circuit board with high heat-resistance insulation. As stated above, the heat generated by the LED is unable to be transferred to the heat sink promptly due to the low conduction efficiency of the polymer layer with high heat-resistance. Thus, the temperature increase of the LED, reduction on working efficiency and even the damage of LED will be caused to happen.
3. Heat sink paste is used between the layers of the structure. Since the thermal conductivity of the heat sink paste is only 1~5 w/k·m, the heat generated by the LED is unable to be transferred to the heat sink promptly. Furthermore, bubbles is likely to be produced between the layers of structure and the heat sink paste due to anthropogenic factor during distribution of the heat sink paste, or various heat-resistance situations occur in view of structural defect. Therefore, huge heat unsteadiness will be occurred on the components.

So far, the way of solving the above heat-resistance problem is mostly to increase the area of heat sink or to raise the rotation speed of fan so as to enhance the heat dissipation efficiency. However, this measure of increasing the efficiency in the heat sink terminal fails to contribute efficiently and reasonably to the improvement or solution with respect to the heat transfer efficiency between the heat source (i.e., the LED) and the heat dissipating terminal (i.e., the heat sink).

So far, there are several ways developed to solve the above heat dissipation problem listed as below.

Firstly, in Japanese Patent No. JP2004-200347, an electrically conductive mixture using diamond and metal material is disclosed as an electrically conductive heat-dissipating layer of lamination between the p-n diodes of the LED. However, this technology only improves the heat dissipation structure in the interior of the LED, thus does not provide any efficient solution with respect to the heat jamming in the insulation package layer with high heat-resistance outside the LED.

Secondly, in Japanese Patent No. JP-Heisei 5-347369, a constitution of small granular diamond mixing with epoxy resin or silicone resin is disclosed which is used as a heat-dissipating insulation package layer for electronic components. This technology improves heat dissipation problem of package layer on the upper portion of electronic components, but fails to solve defect problem of interface between the insulated circuit board with high heat-resistance and the heat sink paste. In addition, since this technology uses the constitution of small granular diamond mixing with epoxy resin, quartz granule or alumina granule as heat-dissipating insulation package layer for electronic components, the tensile stress feature of which is unable to meet the requirement of suppressing the damage caused by expansion and contraction caused by long-term temperature variation.

Thirdly, in PRC Patent No. CN15455148, a technology is disclosed in which LED with big power is adhered to the heat dissipating structure on the diamond substrate. This technology utilizes multi-layers heat sink paste between structure layers so as to achieve good heat transfer. However, in the case of practical application, heat resistance is raised in view of the increase of bubbles, impurities and material defect caused by the increase of interface. Therefore, this technology did not propose a total solution for heat transfer including the items of lowering heat-resistance channels, reducing the complexity of heat conduction structure and the number of interface, ensuring the interface bubbles of the heat sink paste.

SUMMARY OF THE INVENTION

The main object of the light emitting diode lamp with high heat-dissipation capacity of the present invention is to provide a lamp in which the lamp body itself is a heat dissipation structure, a metal circuit being directly created on the lamp body so that no additional circuit board is needed. Furthermore, heat resistance between structure layers can be lowered so as to achieve the effectiveness of exhausting the waste heat promptly and concretely from the heat source.

In one aspect of the present invention, a light emitting diode lamp with high heat-dissipation capacity is provided, comprising a heat sink unit, having a plurality of air-flow channels, a heat absorption end and a heat emitting end;

an electrical insulation layer with high heat conductivity laminated on the heat absorption end of the heat sink unit;

a metal circuit created on the electrical insulation layer with high heat conductivity; and at least one light emitting diode packaged on the metal circuit.

Preferably, the electrical insulation layer with high heat conductivity is formed by a laminating method selected from vapor deposition, sputtering, stamping, injecting, screen printing, sintering and spin-coating. The material of the electrical insulation layer with high heat conductivity is a constitution formed by a material selected from one or more of diamond, aluminum nitride, silicon carbide and diamond powder mixing with polymer material, diamond-like carbon or nano diamond.

Preferably, the heat absorption end of the heat sink unit is selected from a design of a flat surface, a concave surface or a convex surface.

Preferably, the air-flow channels of the heat sink unit is defined to have at least two openings opposite to each other and to communicate with outside thereby.

Preferably, the included angle between each air-flow channel and the vertical axis is in the range of 0~60 degree.

Preferably, the surface of the heat emitting end is provided with a micro-structure selected from micro-pit, micro-protrusion, porosity or sponge-like opening, and a heat radiation layer is formed on the micro-structure by a method selected from vapor deposition, sputtering, electrolyzing, sintering and spin-coating. The material of the heat radiation layer is selected from one or more of diamond, aluminum nitride, silicon carbide, diamond-like carbon or nano diamond.

Preferably, a plurality of fins are provided on the heat emitting end of the heat sink unit, and the air-flow channels are each located between every two-fins.

Preferably, each of the air-flow channels further has an opening which is communicating with the two openings opposite to each other. A closing surface is further provided to connect between every two-fin. At least one air inlet hole is provided on the closing surface.

Preferably, each fin is provided with a micro-structure selected from micro-pit, micro-protrusion, porosity or sponge-like opening, and a heat radiation layer is formed on the micro-structure by a method selected from vapor deposition, sputtering, electrolyzing, sintering and spin-coating. The material of the heat radiation layer is selected from one or more of diamond, aluminum nitride, silicon carbide, diamond-like carbon or nano diamond.

In another aspect of the present invention, a light emitting diode lamp with high heat-dissipation capacity is provided, comprising:

a heat sink unit, having a plurality of air-flow channels, a heat absorption end and a heat emitting end;

at least one lamp body releasably combined with the heat sink unit, an electrical insulation layer with high heat conductivity being formed on the surface of the lamp body, a metal circuit being further created on the electrical insulation layer with high heat conductivity according to demand, and at least one light emitting diode being packaged on the metal circuit.

Preferably, the electrical insulation layer with high heat conductivity is formed by a laminating method selected from vapor deposition, sputtering, stamping, injecting, screen printing, sintering and spin-coating. The material of the electrical insulation layer with high heat conductivity is a constitution formed by a material selected from one or more of diamond, aluminum nitride, silicon carbide and diamond powder mixing with polymer material, diamond-like carbon or nano diamond.

Preferably, the heat absorption end of the heat sink unit is selected from a design of a flat surface, a concave surface or a convex surface.

Preferably, the air-flow channels of the heat sink unit is defined to have at least two openings opposite to each other and to communicate with outside thereby.

Preferably, the included angle between each air-flow channel and the vertical axis is in the range of 0~60 degree.

Preferably, the surface of the heat emitting end is provided with a micro-structure selected from micro-pit, micro-protrusion, porosity or sponge-like opening, and a heat radiation layer is formed on the micro-structure by a method selected from vapor deposition, sputtering, electrolyzing, sintering and spin-coating. The material of the heat radiation layer is selected from one or more of diamond, aluminum nitride, silicon carbide, diamond-like carbon or nano diamond.

Preferably, a plurality of fins are provided on the heat emitting end of the heat sink unit, and the air-flow channels are each located between every two-fins.

Preferably, each of the air-flow channels further has an opening which is communicating with the two openings opposite to each other.

Preferably, a closing surface is further provided to connect between every two-fin, and at least one air inlet hole is provided on the closing surface.

Preferably, each fin is provided with a micro-structure selected from micro-pit, micro-protrusion, porosity or sponge-like opening, and a heat radiation layer is formed on the micro-structure by a method selected from vapor deposition, sputtering, electrolyzing, sintering and spin-coating. The material of the heat radiation layer is selected from one or more of diamond, aluminum nitride, silicon carbide, diamond-like carbon or nano diamond.

Preferably, the light emitting diode lamp is provided with a heat pipe or a thermoelectric cooling chip between the lamp body and the heat sink unit.

In still another aspect of the present invention, a light emitting diode lamp with high heat-dissipation capacity is provided, comprising:

a heat sink unit having a heat absorption end and a heat emitting end, the heat emitting end is provided with a micro-structure selected from micro-pit, micro-protrusion, porosity or sponge-like opening, and a heat radiation layer is formed on the micro-structure;

an electrical insulation layer with high heat conductivity formed on the heat absorption end of the heat sink unit;

a metal circuit created on the electrical insulation layer with high heat conductivity; and at least one light emitting diode packaged on the metal circuit.

DETAILED DESCRIPTION OF THE PREFERRED EMBODIMENTS

Figure 1:
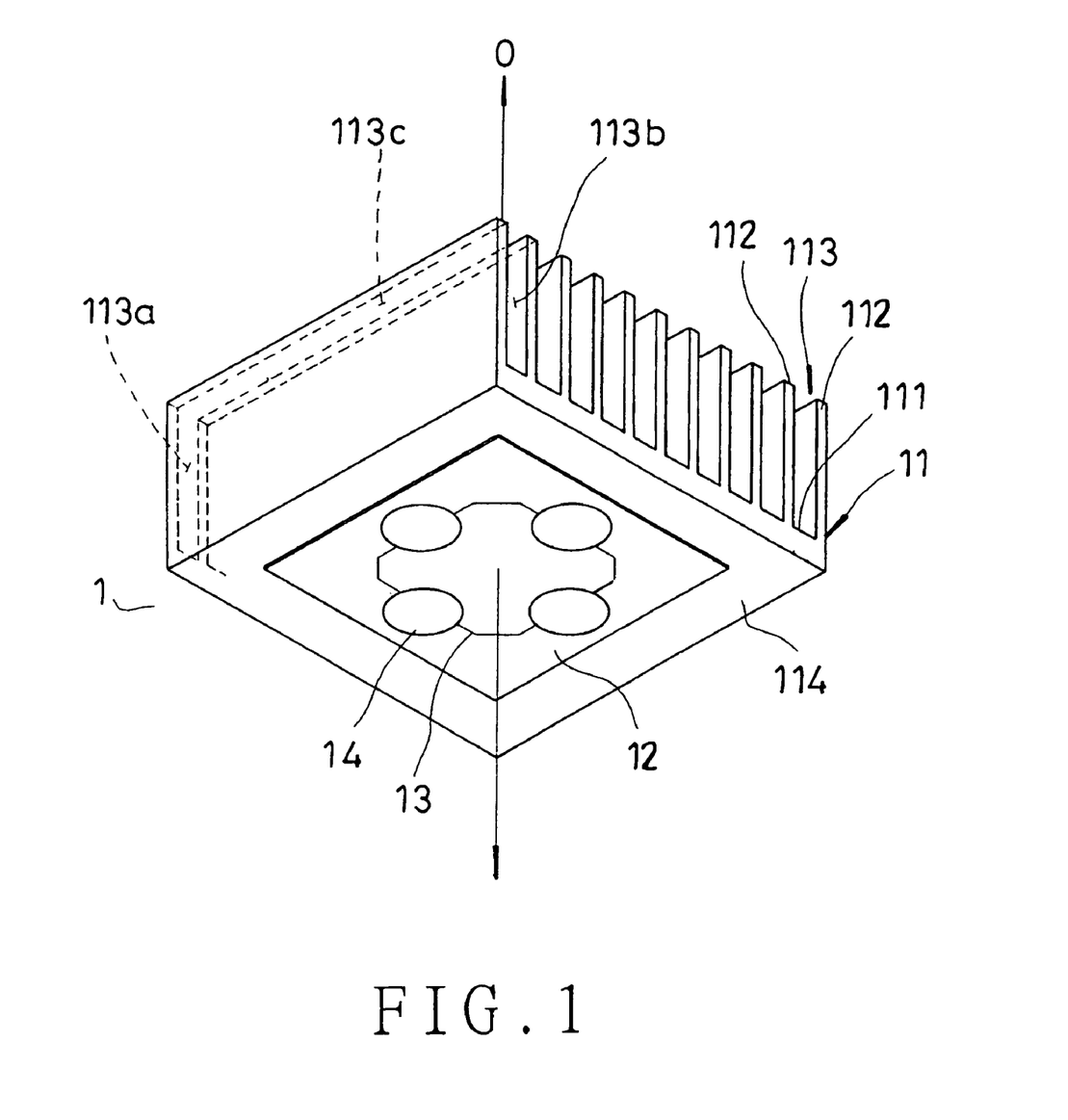
FIG. 1 is a perspective outline view of the first embodiment of the light emitting diode lamp with high heat-dissipation capacity of the present invention.
Figure 2:
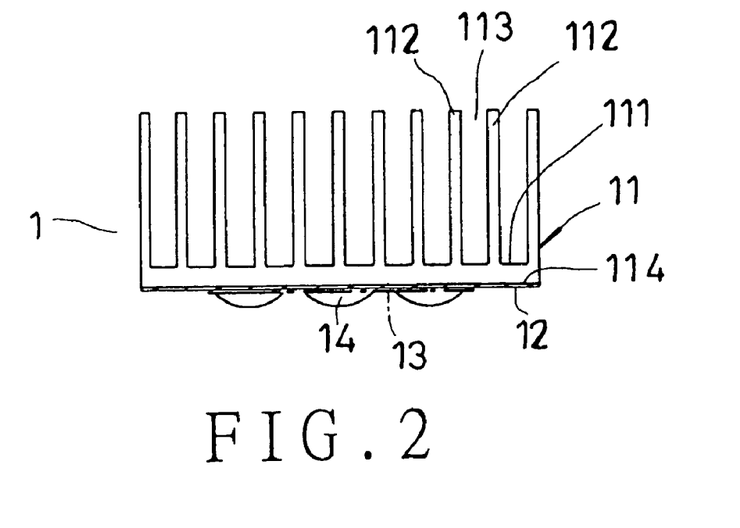
FIG. 2 is a side view of a plate type heat sink unit of the present invention in which the heat absorption end is a flat surface.

Referring to FIG. 1 and 2, the first embodiment of the light emitting diode lamp with high heat-dissipation capacity of the present invention are shown.

In this embodiment, the light emitting diode lamp (1) with high heat-dissipation capacity comprises a plate type heat sink unit (11). A plurality of fins (112) are provided on the heat emitting end (111) to extend along the axial direction (0) of the heat sink unit (11). An air-flow channel (113) is defined between two fins (112), which has two openings (113a), (113b) opposite to each other and a third opening (113c) communicating with both openings (113a), (113b). An electrical insulation layer (12) with high heat conductivity is formed on the heat absorption end (114) of the heat sink unit (11) by a lamination method selected from vapor deposition, sputtering, stamping, injection, screen printing, sintering or spin-coating. The material of the electrical insulation layer (12) with high heat conductivity is a constitution formed by a material selected from one or more of diamond, aluminum nitride, silicon carbide and diamond powder mixing with polymer material, diamond-like carbon or nano diamond. A metal circuit (13) is created on the electrical insulation layer (12) with high heat conductivity, and at least one light emitting diode (14) is packaged on the metal circuit (13).

Figure 3:
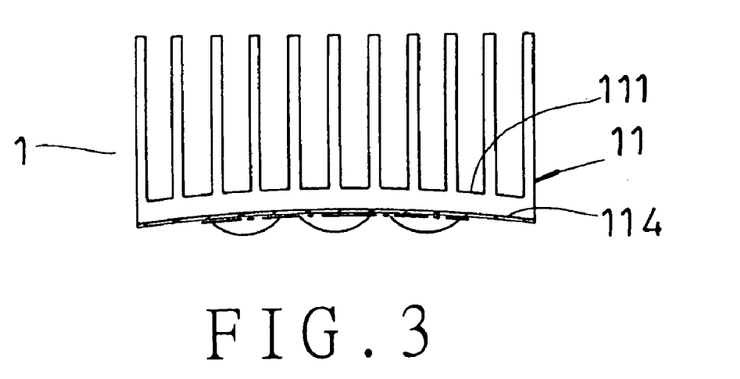
FIG. 3 is a side view of a plate type heat sink unit of the present invention in which the heat absorption end is a concaved surface.
Figure 4:
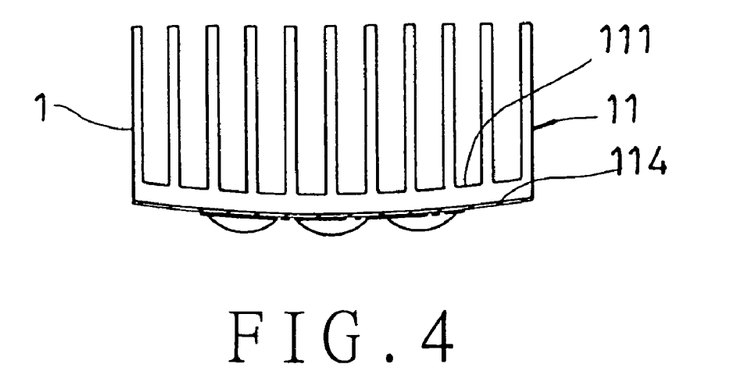
FIG. 4 is a side view of a plate type heat sink unit of the present invention in which the heat absorption end is a convexo surface.

Furthermore, the heat absorption end (114) of the heat sink unit (11) of the light emitting diode lamp (1) with high heat-dissipation capacity in this embodiment is a flat surface design. However, the heat absorption end (114) can also be a concave surface or a convex surface design, as shown in FIG. 3 or 4.

Figure 5:
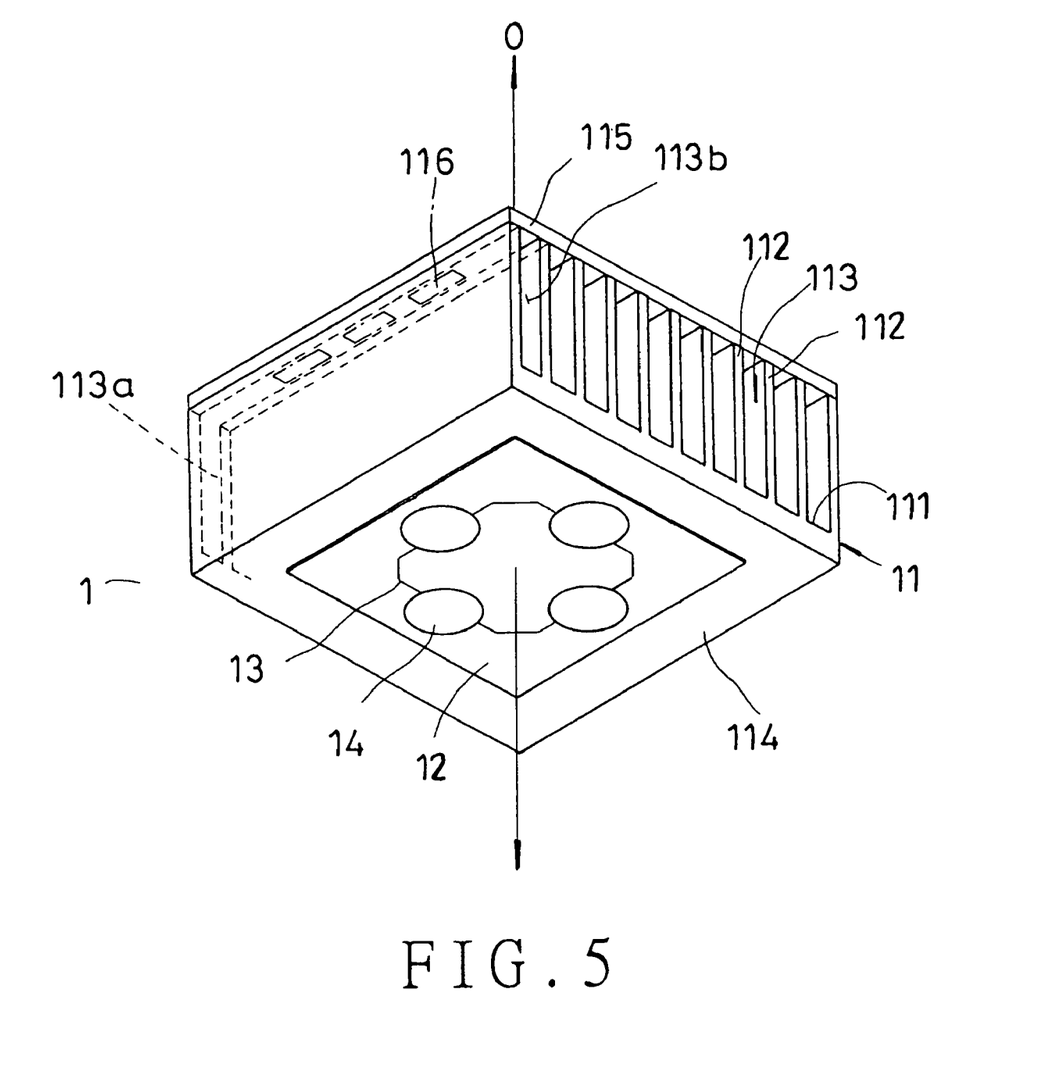
FIG. 5 is a perspective outline view of a plate type heat sink unit of the present invention in which a closing surface is provide.

As shown in FIG. 5, the light emitting diode lamp (1) with high heat-dissipation capacity further has a closing surface (115) connected between every two fins (112). The closing surface (115) is used to close the third opening (113c) of each air-flow channel (113) such that the air-flow channel (113) presents only two openings (113a), (113b) opposite to each other. At least one air inlet hole (116) is provided on the closing surface (115).

Figure 6:
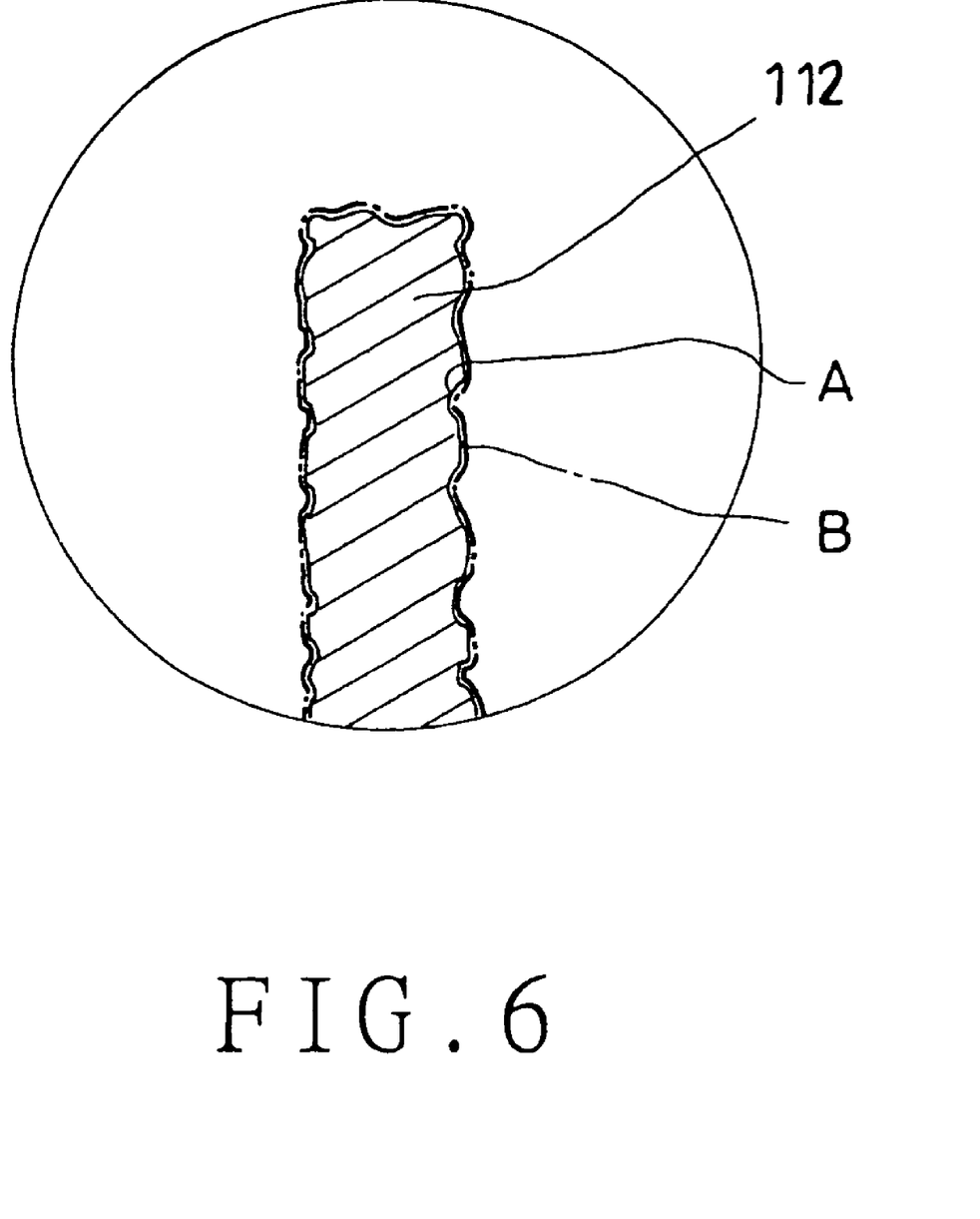
FIG. 6 is a partial schematic enlarged view of the heat sink unit of the present invention.

Furthermore, the surface of each fin (112) of the heat sink unit (11) is provided with micro-structure (A) which can increase the specific surface area of the heat sink unit (11), as shown in FIG. 6. The micro-structure is presented as the shape of micro-pit, micro-protrusion, porosity or sponge-like opening, and a heat radiation layer (B) is formed on the surface of the micro-structure (A) by vapor deposition, sputtering, electrolyzing, sintering or spin-coating. The material of the heat radiation layer (B) is selected from one or more of diamond, aluminum nitride, silicon carbide, diamond-like carbon or nano diamond.

Figure 7:
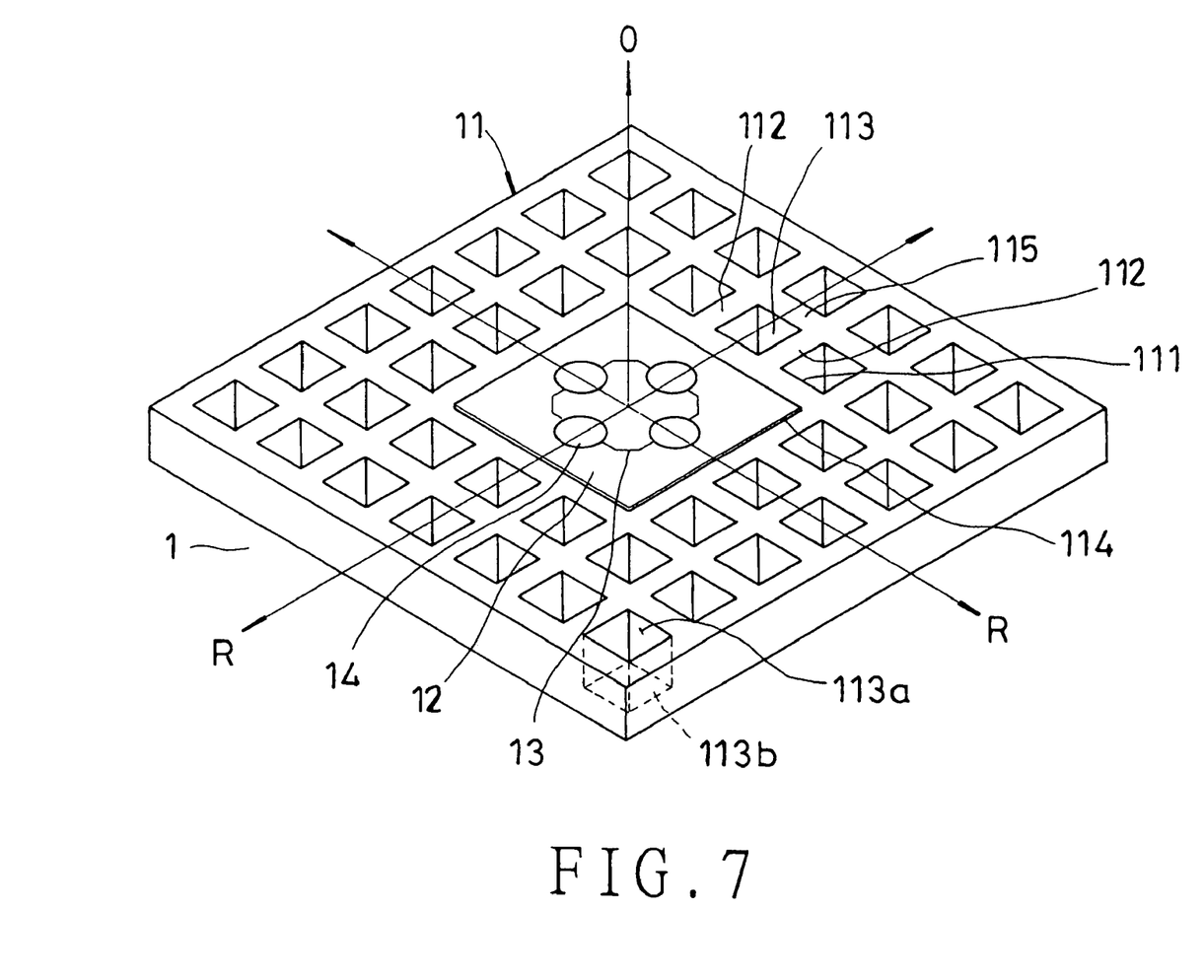
FIG. 7 is a perspective outline view of the second embodiment of the light emitting diode lamp with high heat-dissipation capacity of the present invention.
Figure 8:
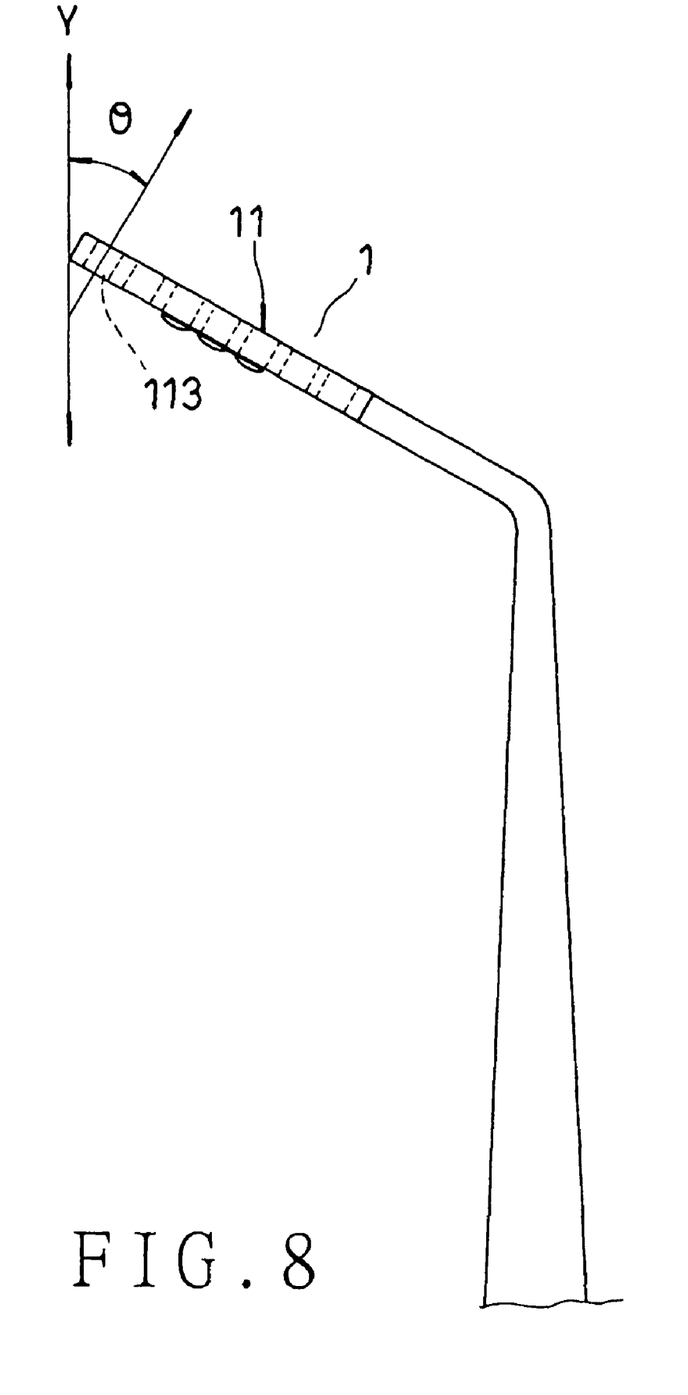
FIG. 8 is a schematic view showing the application as a road lamp of the present invention.

Further referring to FIG. 7, the heat sink unit (11) of the light emitting diode lamp (1) with high heat-dissipation capacity is formed as rectangular shape. A plurality of fins (112) are provided on the heat emitting end (111) of the heat sink unit (11) to extend along the radial direction (R) of the heat sink unit (11). A closing surface (115) is provided to connect between every two fins (112). An air-flow channel (113) is defined by the space enclosed by two fins (112) and a closing surface (115) such that each air-flow channel (113) presents only two openings (113a), (113b) opposite to each other. Furthermore, the light emitting diode lamp (1) with high heat-dissipation capacity can be applied as road lamp, as shown in FIG. 8. The included angle defined between the air-flow channel (113) of the heat sink unit (11) and the vertical axis (Y) is in the range of 0~60 degrees.

Figure 9:
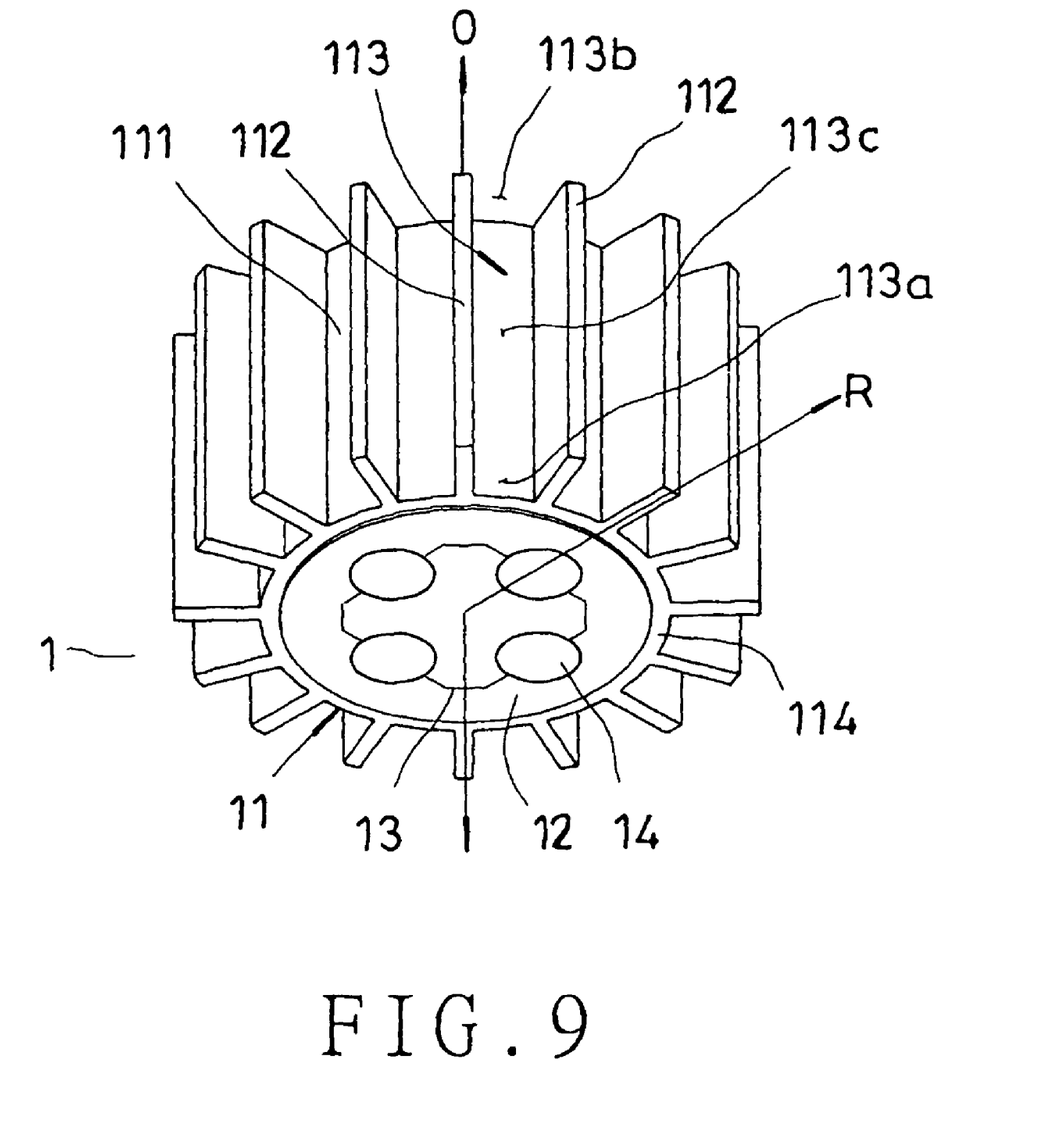
FIG. 9 is a perspective outline view of the third embodiment of the light emitting diode lamp with high heat-dissipation capacity of the present invention.

Referring to FIG. 9, the heat sink unit (11) of the light emitting diode lamp (1) with high heat-dissipation capacity is formed as tubular shape body, in which a plurality of fins (112) are provided to extend along the radial direction (R) of the heat sink unit (11). A closing surface (115) is provided to connect between every two fins (112). An air-flow channel (113) is defined between every two fins (112), which has two openings (113a), (113b) opposite to each other and a third opening (113c) communicating with both openings (113a), (113b).

Figure 10:
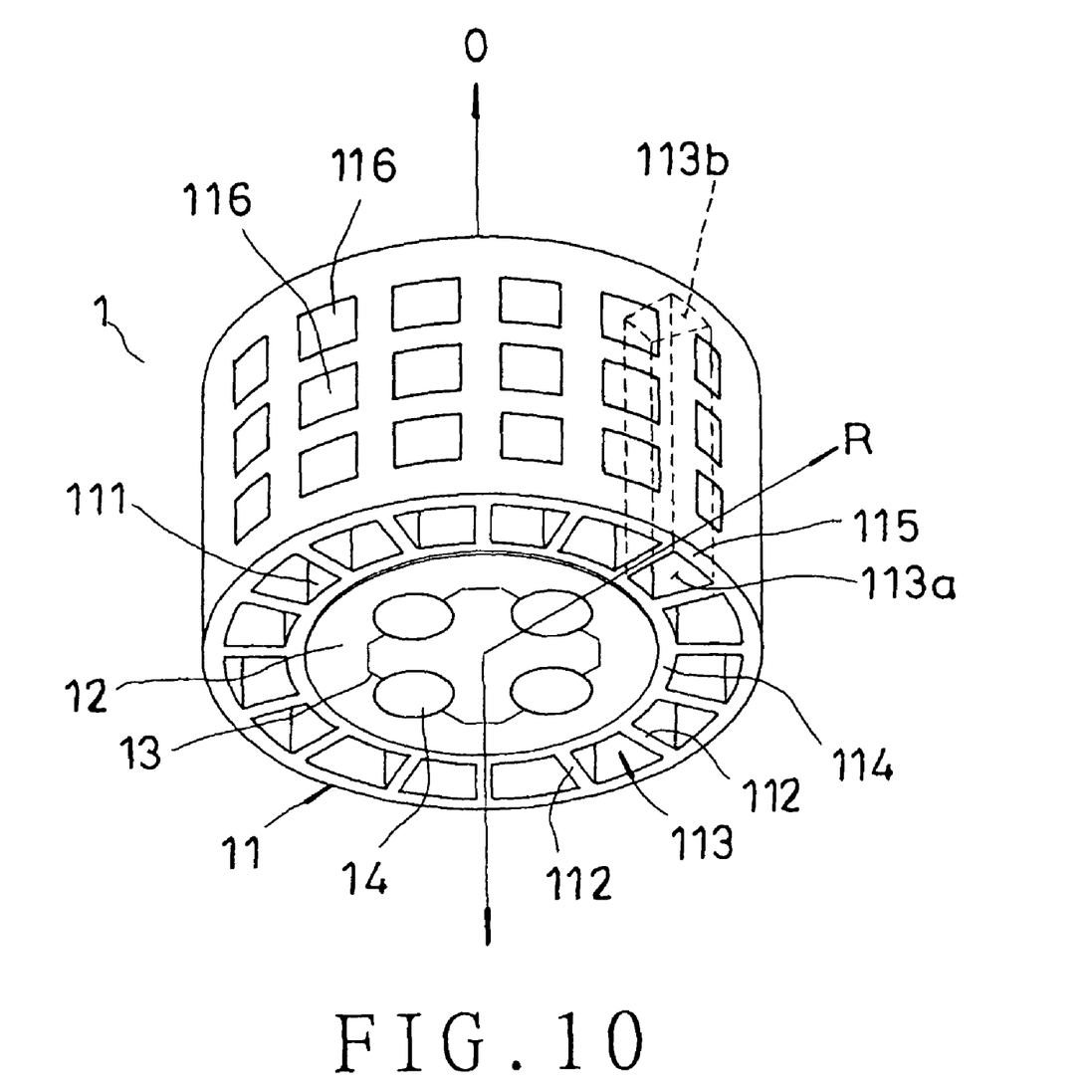
FIG. 10 is a perspective view of a circular tube type heat sink unit of the present invention in which a closing surface is provide.

Referring to FIG. 10, the light emitting diode lamp (1) with high heat-dissipation capacity further has a closing surface (115) connected between every two fins (112) on the heat emitting end (111) of the heat sink unit (11). An air-flow channel (113) is defined by a space enclosed by two fins (112) and a closing surface (115), which has two openings (113a), (113b) opposite to each other. At least one air inlet hole (116) is provided on the closing surface (115).

Figure 11:
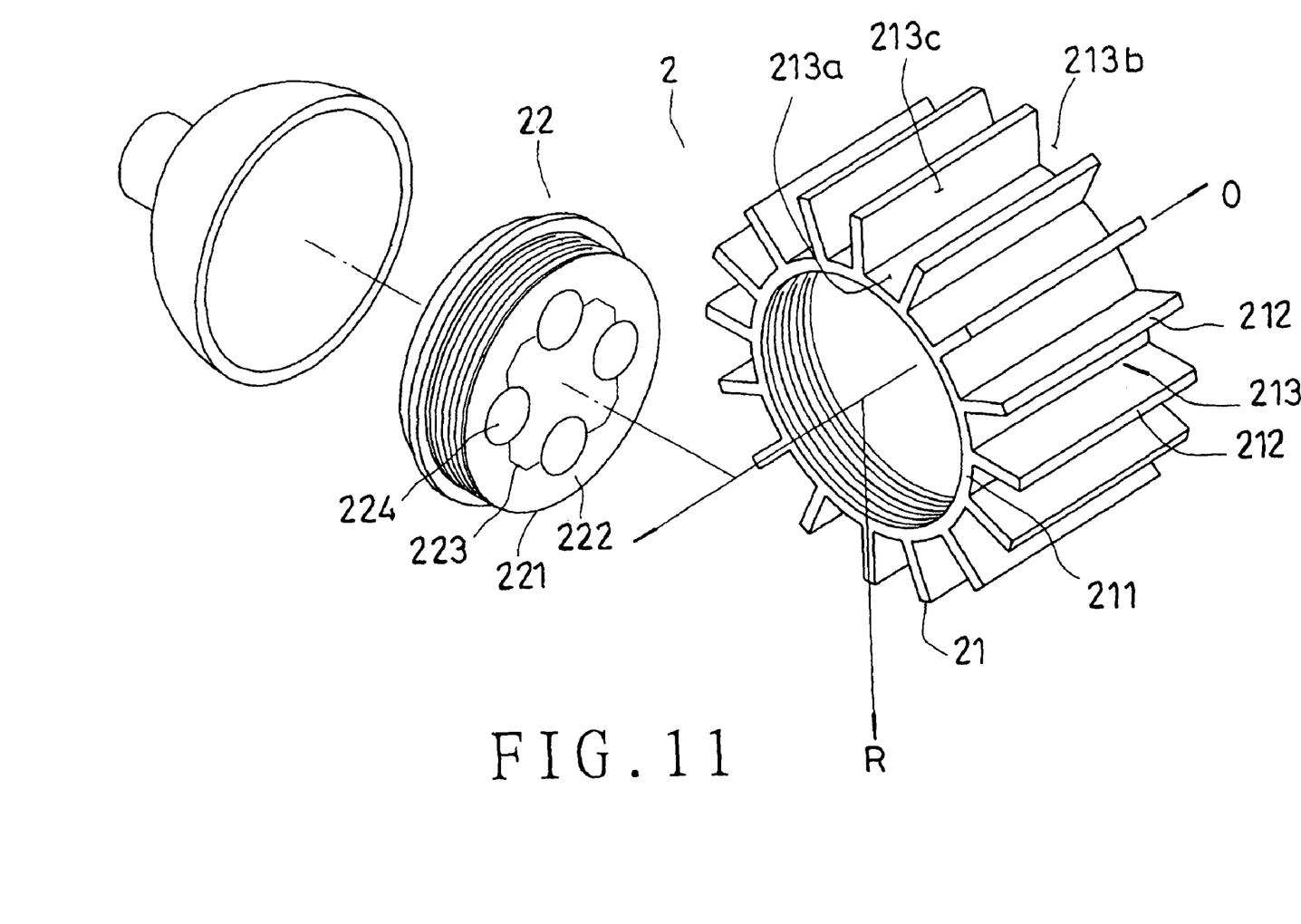
FIG. 11 is a perspective exploded view of the fourth embodiment of the light emitting diode lamp with high heat-dissipation capacity of the present invention.

Referring to FIG. 11, the light emitting diode lamp (2) with high heat-dissipation capacity has a heat sink unit (21) and a lamp body (22) in which the lamp body (22) is releasably combined with the heat sink unit (21). The heat sink unit (21) in this embodiment is a tubular shape body, A plurality of fins (212) are provided on the heat emitting end (211) of the heat sink unit (21) to extend along the radial direction (R) of the heat sink unit (21). An air-flow channel (213) is defined between every two fins (212) and each air-flow channel (213) has two openings (213a), (213b) opposite to each other and a third opening (213c) communicating with both openings (213a), (213b). The surface (221) of the lamp body (22) is of flat surface, concave surface or convex surface design, An electrical insulation layer (222) with high heat conductivity is formed on the surface (221) of the lamp body (22) by a lamination method selected from vapor deposition, sputtering, stamping, injection, screen printing, sintering or spin-coating. The material of the electrical insulation layer (222) with high heat conductivity is a constitution formed by a material selected from one or more of diamond, aluminum nitride, silicon carbide and diamond powder mixing with polymer material, diamond-like carbon or nano diamond. A metal circuit (223) is created on the electrical insulation layer (222) with high heat conductivity; and at least one light emitting diode (224) is packaged on the metal circuit (223).

Figure 12:
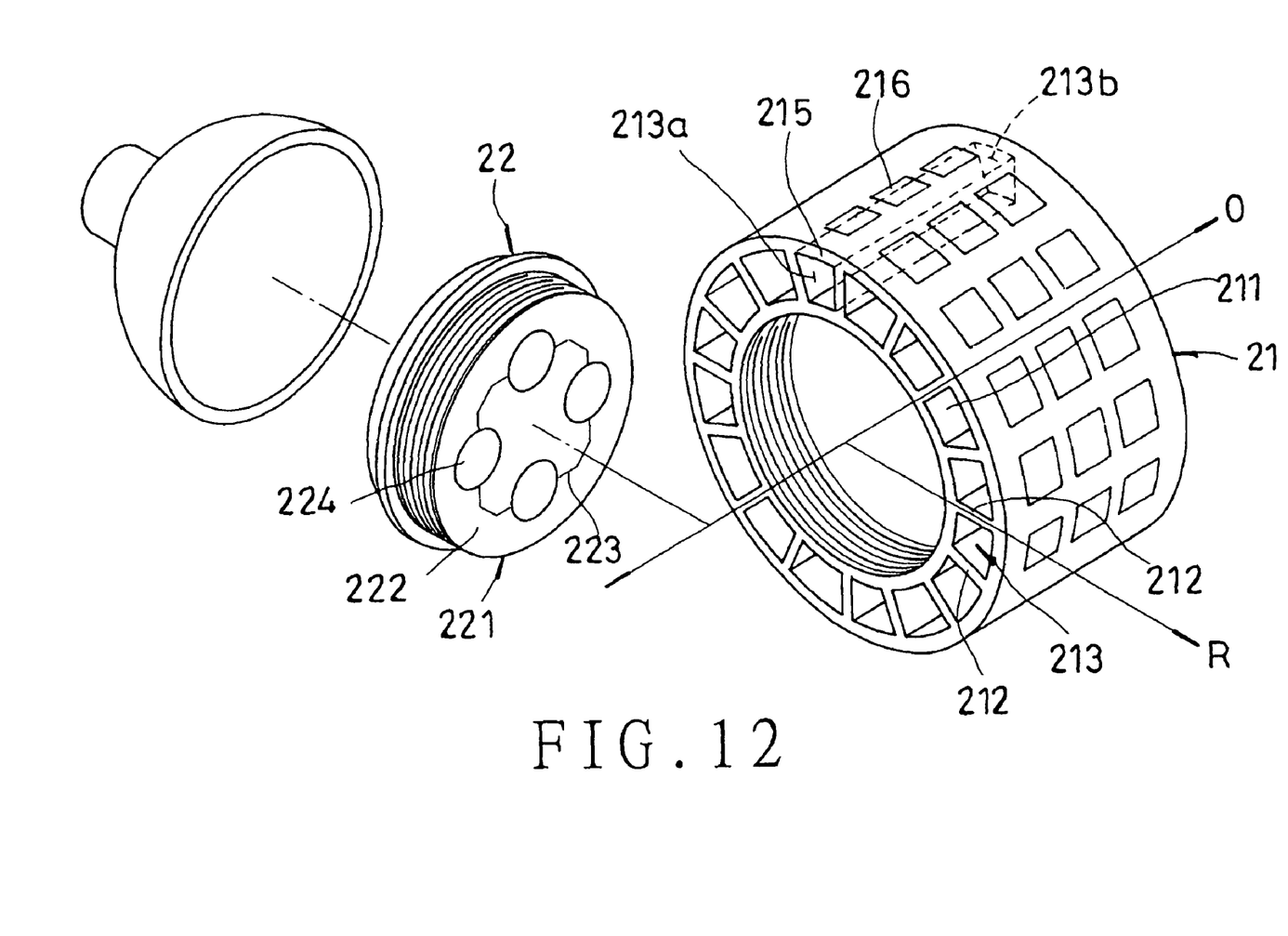
FIG. 12 is a perspective exploded view of the circular tube type heat sink unit having closing surface of the present invention.

The light emitting diode lamp (2) with high heat-dissipation capacity shown in FIG. 12 further has a closing surface (215) connected between every two fins (212) on the heat emitting end (211) of the heat sink unit (21). An air-flow channel (213) is defined by a space enclosed by two fins (212) and a closing surface (215), which has two openings (213a), (213b) opposite to each other. At least one air inlet hole (216) is provided on the closing surface (215).

Furthermore, the surface of each fin (212) of the heat sink unit (21) is provided with micro-structure (A) which can increase the specific surface area of the heat sink unit (21), as shown in FIG. 6. The micro-structure is presented as the shape of micro-pit, micro-protrusion, porosity or sponge-like opening, and a heat radiation layer (B) is formed on the surface of the micro-structure (A) by vapor deposition, sputtering, electrolyzing, sintering or spin-coating. The material of the heat radiation layer (B) is selected from one or more of diamond, aluminum nitride, silicon carbide, diamond-like carbon or nano diamond.

The releasable combination of the above heat sink unit (21) and the lamp body (22) can be conducted by mutual threaded engagement, interlock of hook and engaging slot, and screw fastener. In addition, the light emitting diode lamp (2) with high heat-dissipating capacity is provided with a heat pipe or a thermoelectric cooling chip (not shown in the figures) between the lamp body (22) and the heat sink unit (21) so that the heat generated by the lamp body (22) can be introduced promptly into the heat sink unit (21).

Preferably, a plurality of lamp body (22) is releasably installed on the heat sink unit (21) so that the light emitting diode lamp (2) with high heat-dissipation capacity of the present invention can be applied as car lamp.

Figure 13:
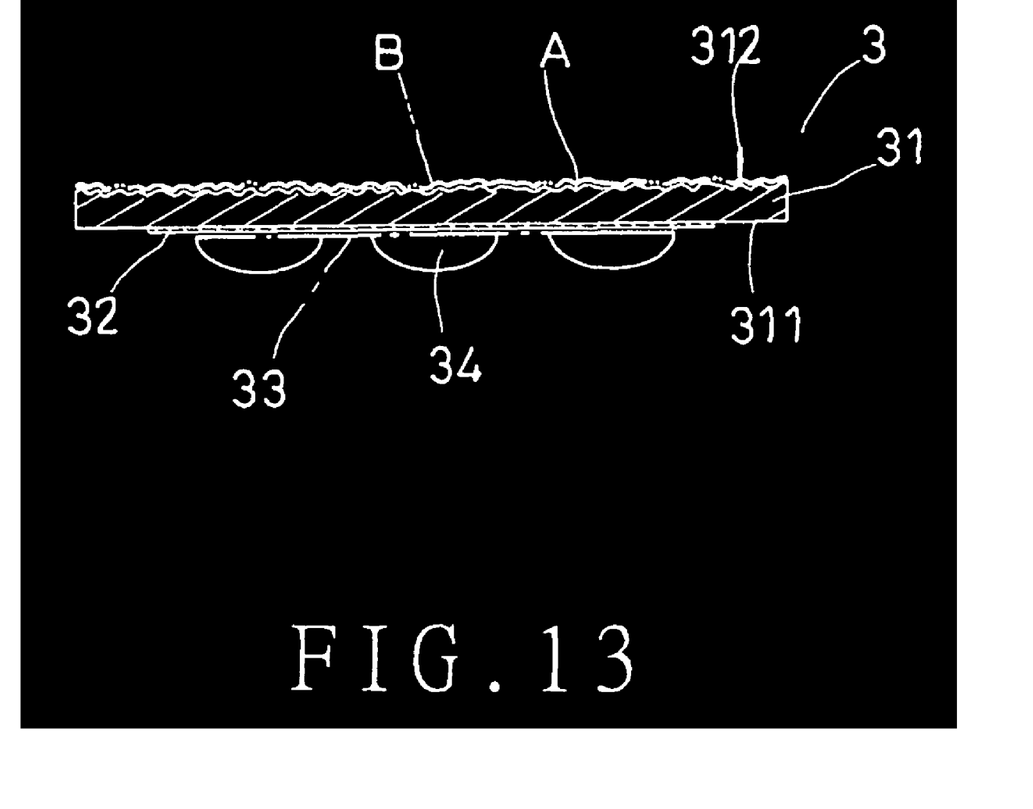
FIG. 13 is a perspective exploded view of the fifth embodiment of the light emitting diode lamp with high heat-dissipation capacity of the present invention.

Referring to FIG. 13, a light emitting diode lamp (3) with high heat-dissipation capacity of still another one aspect of the present invention is shown, comprising:

a heat sink unit (31) having a heat absorption end (311) and a heat emitting end (312), the heat emitting end (312) being provided with one micro-structure (A) selected from micro-pit, micro-protrusion, porosity or sponge-like opening, and a heat radiation layer (B) being formed on the surface of the micro-structure (A) by vapor deposition, sputtering, electro-lyzing, sintering or spin-coating, the material of the heat radiation layer (B) being selected from one or more of diamond, aluminum nitride, silicon carbide, diamond-like carbon or nano diamond.

an electrical insulation layer (32) with high heat conductivity created on the heat absorption end (314) of the heat sink unit (31) by a lamination method selected from vapor deposition, sputtering, stamping, injection, screen printing, sintering or spin-coating, the material of the electrical insulation layer (32) with high heat conductivity being a constitution formed by a material selected from one or more of diamond, aluminum nitride, silicon carbide and diamond powder mixing with polymer material, diamond-like carbon or nano diamond;

a metal circuit (33) created on the electrical insulation layer (32) with high heat conductivity;

at least one light emitting diode (34) packaged on the metal circuit (33).

What is claimed is:

1. A light emitting diode lamp with high heat-dissipation capacity, wherein it comprises:
   a heat sink unit having a plurality of air-flow channels, a heat absorption end and a heat emitting end, each of said plurality of air-flow channels being defined to have at least two openings opposite to each other for communication with respective regions external to said heat sink unit, the surface of said heat emitting end of said heat sink unit being provided with a micro-structure selected from one of micro-pit, micro-protrusion, porosity and sponge-like opening increasing a surface area thereof, and having a heat radiation layer formed on a surface of said micro-structure;
   an electrical insulation layer with high heat conductivity laminated on said heat absorption end of said heat sink unit;
   a metal circuit being created on the electrical insulation layer with high heat conductivity; and
   at least one light emitting diode packaged on the metal circuit.

2. A light emitting diode lamp with high heat-dissipation capacity as claimed in claim 1, wherein the material of said electrical insulation layer with high heat conductivity is a constitution formed by a material selected from one or more of diamond, aluminum nitride, silicon carbide and diamond powder mixing with polymer material, diamond-like carbon or nano diamond.

3. A light emitting diode lamp with high heat-dissipation capacity as claimed in claim 1, wherein said heat absorption end of said heat sink unit is selected from a design of a flat surface, a concave surface or a convex surface.

4. A light emitting diode lamp with high heat-dissipation capacity as claimed in claim 1, wherein the included angle between each said air-flow channel and the vertical axis is in the range of 0~60 degree.

5. A light emitting diode lamp with high heat-dissipation capacity as claimed in claim 1, wherein a plurality of fins are provided on the heat emitting end of said heat sink unit, and said air-flow channels are each located between every two-fins.

6. A light emitting diode lamp with high heat-dissipation capacity as claimed in claim 5, wherein each of said air-flow channels further has an opening which is communicating with said two openings opposite to each other.

7. A light emitting diode lamp with high heat-dissipation capacity as claimed in claim 5, wherein a closing surface is further provided to connect between every two-fin, and at least one air inlet hole is provided on said closing surface.

8. A light emitting diode lamp with high heat-dissipation capacity, wherein it comprises:
   a heat sink unit having a plurality of air-flow channels, a heat absorption end and a heat emitting end;
   at least one lamp body releasably combined with said heat sink unit, an electrical insulation layer with high heat conductivity being formed on the surface of said lamp body, a metal circuit being further created on said electrical insulation layer with high heat conductivity according to demand, and at least one light emitting diode being packaged on said metal circuit; and
   a heat pipe or a thermoelectric cooling chip provided between said lamp body and said heat sink unit.

9. A light emitting diode lamp with high heat-dissipation capacity as claimed in claim 8, wherein the material of said electrical insulation layer with high heat conductivity is a constitution formed by a material one or more of diamond, aluminum nitride, silicon carbide and diamond powder mixing with polymer material, diamond-like carbon or nano diamond.

10. A light emitting diode lamp with high heat-dissipation capacity as claimed in claim 8, wherein said heat absorption end of said lamp body is selected from a design of a flat surface, a concave surface or a convex surface.

11. A light emitting diode lamp with high heat-dissipation capacity as claimed in claim 8, wherein said air-flow channels is defined to have at least two openings opposite to each other and to communicate with outside thereby.

12. A light emitting diode lamp with high heat-dissipation capacity as claimed in claim 11, wherein the included angle between each said air-flow channel and the vertical axis is in the range of 0~60 degree.

13. A light emitting diode lamp with high heat-dissipation capacity as claimed in claim 11, wherein the surface of said heat emitting end of said heat sink unit is provided with a micro-structure selected from micro-pit, micro-protrusion, porosity or sponge-like opening increasing the specific surface area, and a heat radiation layer is formed on the surface of said micro-structure.

14. A light emitting diode lamp with high heat-dissipation capacity as claimed in claim 11, wherein a plurality of fins are provided on said heat emitting end of said heat sink unit, and said air-flow channels are each located between every two-fins.

15. A light emitting diode lamp with high heat-dissipation capacity as claimed in claim 14, wherein each of said air-flow channels further has a third opening which is communicating with said two openings opposite to each other.

16. A light emitting diode lamp with high heat-dissipation capacity as claimed in claim 14, wherein a closing surface is further provided to connect between every two-fin, and at least one air inlet hole is provided on said closing surface.

17. A light emitting diode lamp with high heat-dissipation capacity as claimed in claim 14, wherein each fin is provided with a micro-structure selected from micro-pit, micro-protrusion, porosity or sponge-like opening, and a heat radiation layer is formed on said micro-structure.

18. A light emitting diode lamp with high heat-dissipation capacity, wherein it comprises:

a heat sink unit having a heat absorption end and a heat emitting end, said heat emitting end being provided with a micro-structure capable of increasing specific surface area, and a heat radiation layer being formed on said micro-structure;
an electrical insulation layer with high heat conductivity laminated on said heat absorption end of said heat sink unit;
a metal circuit formed on said electrical insulation layer with high heat conductivity; and
at least one light emitting diode packaged on said metal circuit.

\* \* \* \* \*